United States Patent
Jung et al.

(10) Patent No.: US 11,855,023 B2
(45) Date of Patent: Dec. 26, 2023

(54) WAFER LEVEL FAN OUT SEMICONDUCTOR DEVICE AND MANUFACTURING METHOD THEREOF

(71) Applicant: Amkor Technology Singapore Holding Pte. Ltd., Singapore (SG)

(72) Inventors: Boo Yang Jung, Seoul (KR); Jong Sik Paek, Kyunggi-do (KR); Choon Heung Lee, Seoul (KR); In Bae Park, Seoul (KR); Sang Won Kim, Seoul (KR); Sung Kyu Kim, Seoul (KR); Sang Gyu Lee, Seoul (KR)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 194 days.

(21) Appl. No.: 17/156,833

(22) Filed: Jan. 25, 2021

(65) Prior Publication Data

US 2021/0217717 A1 Jul. 15, 2021

Related U.S. Application Data

(63) Continuation of application No. 15/656,654, filed on Jul. 21, 2017, now Pat. No. 10,903,181, which is a (Continued)

(51) Int. Cl.
*H01L 21/56* (2006.01)
*H01L 23/00* (2006.01)
(Continued)

(52) U.S. Cl.
CPC .............. *H01L 24/09* (2013.01); *H01L 21/56* (2013.01); *H01L 23/00* (2013.01);
(Continued)

(58) Field of Classification Search
None
See application file for complete search history.

(56) References Cited

U.S. PATENT DOCUMENTS

| 3,868,724 A | 2/1975 | Perrino |
| 3,916,434 A | 10/1975 | Garboushian |

(Continued)

FOREIGN PATENT DOCUMENTS

| JP | 05-109975 | 4/1993 |
| JP | 05-136323 | 6/1993 |

(Continued)

OTHER PUBLICATIONS

IBM Technical Disclosure Bulletin, "Microstructure Solder Mask by Means of a Laser", vol. 36, Issue 11, p. 589, Nov. 1, 1993.
(Continued)

*Primary Examiner* — Sarah K Salerno
(74) *Attorney, Agent, or Firm* — McAndrews, Held & Malloy, Ltd.

(57) ABSTRACT

A wafer level fan out semiconductor device and a manufacturing method thereof are provided. A first sealing part is formed on lateral surfaces of a semiconductor die. A plurality of redistribution layers are formed on surfaces of the semiconductor die and the first sealing part, and solder balls are attached to the redistribution layers. The solder balls are arrayed on the semiconductor die and the first sealing part. In addition, a second sealing part is formed on the semiconductor die, the first sealing part and lower portions of the solder balls. The solder balls are exposed to the outside through the second sealing part. Since the first sealing part and the second sealing part are formed of materials having thermal expansion coefficients which are the same as or similar to each other, warpage occurring to the wafer level fan out semiconductor device can be suppressed.

20 Claims, 8 Drawing Sheets

Related U.S. Application Data continuation of application No. 12/939,588, filed on Nov. 4, 2010, now Pat. No. 9,748,154.

(51) Int. Cl.
*H01L 23/31* (2006.01)
*H01L 23/522* (2006.01)

(52) U.S. Cl.
CPC ........ *H01L 23/3135* (2013.01); *H01L 23/522* (2013.01); *H01L 24/14* (2013.01); *H01L 24/19* (2013.01); *H01L 2224/04105* (2013.01); *H01L 2224/12105* (2013.01); *H01L 2224/73267* (2013.01); *H01L 2924/15172* (2013.01); *H01L 2924/18162* (2013.01); *H01L 2924/3511* (2013.01)

(56) References Cited

U.S. PATENT DOCUMENTS

| | | |
|---|---|---|
| 4,322,778 A | 3/1982 | Barbour et al. |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | MacIver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Djennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,726,493 A | 3/1998 | Yamashita et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,847,453 A | 12/1998 | Uematsu et al. |
| 5,883,425 A | 3/1999 | Kobayashi |
| 5,894,108 A | 4/1999 | Mostafazadeh et al. |
| 5,898,219 A | 4/1999 | Barrow |
| 5,903,052 A | 5/1999 | Chen et al. |
| 5,907,477 A | 5/1999 | Tuttle et al. |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,622 A | 3/2000 | Wallace |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Panchou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,316,285 B1 | 11/2001 | Jiang et al. |
| 6,236,700 B1 | 12/2001 | Bai et al. |
| 6,326,700 B1 | 12/2001 | Bai et al. |
| 6,351,031 B1 | 2/2002 | Iijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,380,615 B1 | 4/2002 | Park et al. |
| 6,392,160 B1 | 5/2002 | Andry et al. |
| 6,395,578 B1 | 5/2002 | Shin et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,448,510 B1 | 9/2002 | Neftin et al. |
| 6,451,509 B2 | 9/2002 | Keesler et al. |
| 6,479,762 B2 | 11/2002 | Kusaka |
| 6,489,676 B2 | 12/2002 | Taniguchi et al. |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,638 B2 | 4/2003 | Fischer et al. |
| 6,586,682 B2 | 7/2003 | Strandberg |
| 6,608,757 B1 | 8/2003 | Bhatt et al. |
| 6,660,559 B1 | 12/2003 | Huemoeller et al. |
| 6,715,204 B1 | 4/2004 | Tsukada et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,838,776 B2 | 1/2005 | Leal et al. |
| 6,888,240 B2 | 5/2005 | Towle et al. |
| 6,919,514 B2 | 7/2005 | Konrad et al. |
| 6,921,968 B2 | 7/2005 | Chung |

(56) References Cited

U.S. PATENT DOCUMENTS

| | | |
|---|---|---|
| 6,921,975 B2 | 7/2005 | Leal et al. |
| 6,931,726 B2 | 8/2005 | Boyko et al. |
| 6,946,325 B2 | 9/2005 | Yean et al. |
| 6,953,995 B2 | 10/2005 | Farnworth et al. |
| 6,963,141 B2 | 11/2005 | Lee et al. |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,087,514 B2 | 8/2006 | Shizuno |
| 7,125,744 B2 | 10/2006 | Takehara et al. |
| 7,185,426 B1 | 3/2007 | Hiner et al. |
| 7,189,593 B2 | 3/2007 | Lee |
| 7,198,980 B2 | 4/2007 | Jiang et al. |
| 7,242,081 B1 | 7/2007 | Lee |
| 7,282,394 B2 | 10/2007 | Cho et al. |
| 7,285,855 B2 | 10/2007 | Foong |
| 7,345,361 B2 | 3/2008 | Mallik et al. |
| 7,372,151 B1 | 5/2008 | Fan et al. |
| 7,420,809 B2 | 9/2008 | Lim et al. |
| 7,429,786 B2 | 9/2008 | Karezos et al. |
| 7,459,202 B2 | 12/2008 | Magera et al. |
| 7,548,430 B1 | 6/2009 | Huemoeller et al. |
| 7,550,857 B1 | 6/2009 | Longo et al. |
| 7,633,765 B1 | 12/2009 | Scanlan et al. |
| 7,671,457 B1 | 3/2010 | Hiner et al. |
| 7,777,351 B1 | 8/2010 | Berry et al. |
| 7,825,520 B1 | 11/2010 | Longo et al. |
| 2002/0017712 A1 | 2/2002 | Bessho et al. |
| 2002/0061642 A1 | 5/2002 | Haji et al. |
| 2002/0066952 A1 | 6/2002 | Taniguchi et al. |
| 2002/0195697 A1 | 12/2002 | Mess et al. |
| 2003/0025199 A1 | 2/2003 | Wu et al. |
| 2003/0128096 A1 | 7/2003 | Mazzochette |
| 2003/0134450 A1 | 7/2003 | Lee |
| 2003/0141582 A1 | 7/2003 | Yang et al. |
| 2003/0197284 A1 | 10/2003 | Khiang et al. |
| 2004/0063246 A1 | 4/2004 | Karnezos |
| 2004/0089944 A1* | 5/2004 | Watanabe ........... H01L 23/5389 257/734 |
| 2004/0145044 A1 | 7/2004 | Sugaya et al. |
| 2004/0159462 A1 | 8/2004 | Chung |
| 2004/0256734 A1* | 12/2004 | Farnworth .............. H01L 24/16 257/E21.705 |
| 2004/0262753 A1* | 12/2004 | Kashiwazaki .......... H01L 24/81 257/E21.511 |
| 2005/0046002 A1 | 3/2005 | Lee et al. |
| 2005/0116324 A1 | 6/2005 | Yamaguchi |
| 2005/0139985 A1 | 6/2005 | Takahashi |
| 2005/0145994 A1 | 7/2005 | Edelstein et al. |
| 2005/0161799 A1 | 7/2005 | Jobetto |
| 2005/0242425 A1 | 11/2005 | Leal et al. |
| 2005/0258537 A1 | 11/2005 | Huang et al. |
| 2006/0008944 A1 | 1/2006 | Shizuno |
| 2006/0270108 A1 | 11/2006 | Farnworth et al. |
| 2007/0273049 A1 | 11/2007 | Khan et al. |
| 2007/0281471 A1 | 12/2007 | Hurwitz et al. |
| 2007/0290376 A1 | 12/2007 | Zhao et al. |
| 2008/0164599 A1 | 7/2008 | Brunnbauer et al. |
| 2008/0197469 A1 | 8/2008 | Yang et al. |
| 2008/0230887 A1 | 9/2008 | Sun et al. |
| 2010/0073663 A1 | 3/2010 | Meyer |
| 2010/0204573 A1 | 8/2010 | Spohn et al. |
| 2010/0237506 A1 | 9/2010 | Brunnbauer et al. |
| 2010/0320624 A1 | 12/2010 | Kang et al. |
| 2011/0157853 A1 | 6/2011 | Goh |
| 2011/0193222 A1 | 8/2011 | Usui et al. |
| 2011/0227220 A1* | 9/2011 | Chen ...................... H01L 25/16 438/109 |
| 2011/0241222 A1 | 10/2011 | Sezi et al. |

FOREIGN PATENT DOCUMENTS

| | | |
|---|---|---|
| JP | 07-017175 | 1/1995 |
| JP | 08-190615 | 7/1996 |
| JP | 10-334205 | 12/1998 |

OTHER PUBLICATIONS

Kim et al., "Application of Through Mold via (TMV) as PoP base package", 58th ECTC Proceedings, May 2008, Lake Buena Vista, FL, 6 pages, IEEE.

Scanlan, "Package-on-package (PoP) with Through-mold Vias", Advanced Packaging, Jan. 2008, 3 pages, vol. 17, Issue 1, PennWell Corporation.

Hiner et al., "Printed Wiring Motherboard Having Bonded Interconnect Redistribution Mesa", U.S. Appl. No. 10/992,371, filed Nov. 18, 2004.

Huemoeller et al., "Build up Motherboard Fabrication Method and Structure", U.S. Appl. No. 11/824,395, filed Jun. 29, 2007.

Huemoeller et al., "Buildup Dielectric Layer Having Metallization Pattern Semiconductor Package Fabrication Method", U.S. Appl. No. 12/387,691, filed May 5, 2009.

Miller Jr. et al., "Thermal via Heat Spreader Package and Method", U.S. Appl. No. 12/421,118, filed Apr. 9, 2009.

Scanlan et al., "Semiconductor Package Including a Top-Surface Metal Layer for Implementing Circuit Features", U.S. Appl. No. 12/589,839, filed Oct. 28, 2009.

Hiner et al., "Semiconductor Package Including Top-Surface Terminals for Mounting Another Semiconductor Package", U.S. Appl. No. 12/655,724, filed Jan. 5, 2010.

Hiner et al., "Semiconductor Package Including Top-Surface Terminals for Mounting Another Semiconductor Package", U.S. Appl. No. 12/802,661, filed Jun. 10, 2010.

Scanlan et al., "Semiconductor Package Including a Top-Surface Metal Layer for Implementing Circuit Features", U.S. Appl. No. 12/802,715, filed Jun. 10, 2010.

Scanlan, "Stacked Redistribution Layer (RDL) Die Assembly Package", U.S. Appl. No. 12/924,493, filed Sep. 27, 2010.

\* cited by examiner

— WAFER LEVEL FAN OUT SEMICONDUCTOR DEVICE AND MANUFACTURING METHOD THEREOF

TECHNICAL FIELD

The present application relates to a wafer level fan out semiconductor device and a manufacturing method thereof.

BACKGROUND

To cope with the trend towards smaller, lighter and higher-functionality electronic products, demand for smaller, lighter and higher-functionality electronic components integrated therein is being driven. Such demand has brought advances in various semiconductor packaging techniques along with semiconductor designing and manufacturing techniques, representative examples thereof may include an area array type, a ball grid array (BGA) type based on a surface mount type packaging technique, a flip-chip type, a chip size package (CSP) type, a wafer level fan out semiconductor device, and so on.

In the conventional wafer level fan out semiconductor device, a warpage phenomenon may undesirably occur to the completed device.

Further, in the conventional wafer level fan out semiconductor device, solder balls may be easily detached during thermal expansion or shrinkage.

BRIEF DESCRIPTION OF THE DRAWINGS

Common reference numerals are used throughout the drawings and the detailed description to indicate the same or similar elements.

DETAILED DESCRIPTION

Figure 1:
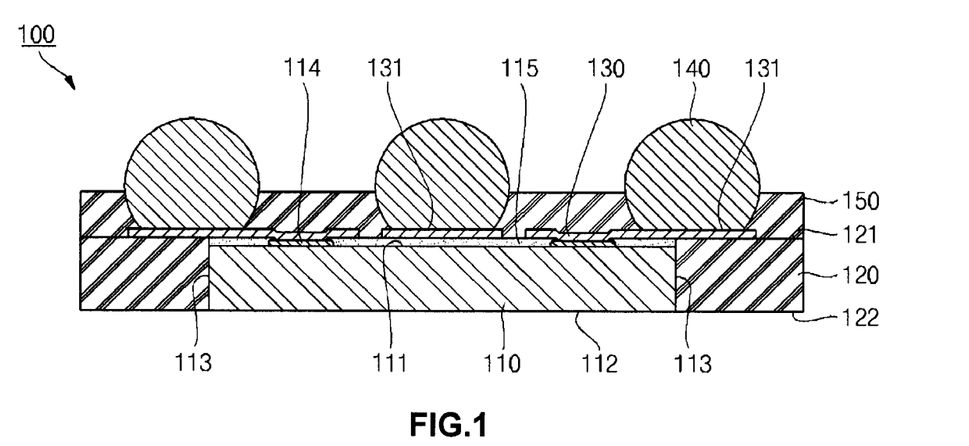
FIG. 1 is a cross-sectional view of a wafer level fan out semiconductor device according to an embodiment.

As an overview and in accordance with one embodiment, referring to FIG. 1, a wafer level fan out semiconductor device 100 includes a semiconductor die 110 having a first surface 111, a second surface 112, third surfaces 113 between the first surface 111 and the second surface 112, bond pads 114 coupled to the first surface 111, and a passivation layer 115 coupled the first surface 111 and having openings therein exposing the bond pads 114.

A first sealing part 120 is coupled to the third surfaces 113 of the semiconductor die 110. Redistribution layers 130 have first ends coupled to the bond pads 114 and extend on to at least the passivation layer 115. Solder balls 140 are coupled to ball lands 131 of the redistribution layers 130. Further, a second sealing part 150 encapsulates the passivation layer 115, the first sealing part 120, the redistribution layers 130, and lower portions of the solder balls 140.

In one embodiment, the first sealing part 120 and the second sealing part 150 have the same thermal expansion coefficient thus minimizing warpage of the wafer level fan out semiconductor device 100. Further, since the solder balls 140 are fixed and locked by the second sealing part 150 to the ball lands 131 of the redistribution layers 130, detachment between the redistribution layers 130 and the solder balls 140 is suppressed. In addition, since the second surface 112 of the semiconductor die 110 is exposed to the outside, heat dissipation efficiency of the semiconductor die 110 is maximized.

Now in more detail, referring to FIG. 1, a cross-sectional view of a wafer level fan out semiconductor device 100 is illustrated.

As illustrated in FIG. 1, the wafer level fan out semiconductor device 100 includes a semiconductor die 110, a first sealing part 120, a plurality of redistribution layers 130, a plurality of solder balls 140, and a second sealing part 150.

The semiconductor die 110 includes a first surface 111 that is approximately planar, a second surface 112 that is approximately planar and opposite to the first surface 111, and a plurality of third surfaces 113 that are disposed between the first surface 111 and the second surface 112 and are substantially planar. In addition, the semiconductor die 110 may further include a plurality of bond pads 114 formed on the first surface 111. First surface 111, second surface 112 and third surfaces 113 are sometimes called an active surface 111, an inactive surface 112, and sides 113.

Further, the semiconductor die 110 includes a passivation layer 115 formed at the outer periphery of the plurality of bond pads 114 on the first surface 111. Stated another way, the passivation layer 115 has bond pad openings formed therein that expose the bond pads 114 except for the outer periphery of the bond pads 114 that may remain covered by the passivation layer 115. The passivation layer 115 may be made of at least one selected from the group consisting of polyimide (PI), benzocyclobutene (BCB), polybenzoxazole (PBO), bismaleimideTriazine (BT), phenolic resin, epoxy, silicone, oxide ($SiO_2$), nitride ($Si_3N_4$), and equivalents thereof. However, the kinds of materials for the passivation layer 115 are not limited to those specifically listed herein.

The first sealing part 120 is formed on each of the third surfaces 113 of the semiconductor die 110. Like the semiconductor die 110, the first sealing part 120 may include a first surface 121 that is substantially coplanar with a surface of the passivation layer 115 formed on the semiconductor die 110 and a second surface 122 that is substantially coplanar with the second surface 112 of the semiconductor die 110.

The first sealing part 120 allows the second surface 112 of the semiconductor die 110 to be directly exposed to the outside. In addition, the first sealing part 120 may be made of at least one selected from the group consisting of an epoxy-molding compound, a liquid encapsulant, and equivalents thereof. However, the kinds of materials for the first sealing part 120 are not limited to those specifically listed herein. In practice, the first sealing part 120 may be made of an epoxy molding compound using a mold.

The plurality of redistribution layers 130 are formed on the semiconductor die 110 and the first sealing part 120. That is to say, first ends of the plurality of redistribution layers 130 are electrically connected to the plurality of bond pads 114 of the semiconductor die 110 and second ends thereof extend to the passivation layer 115 or to the first surface 121 of the first sealing part 120. That is to say, the redistribution layers 130 redistribute the plurality of bond pads 114 that are peripherally distributed or the plurality of bond pads 114 that are centrally distributed in a matrix configuration to be distributed not only on the first surface 111 of the semiconductor die 110 but also on the first surface 121 of the first sealing part 120 positioned at the sides 113 of the semiconductor die 110.

In addition, a ball land 131 having an approximately circular shape is formed at the end of each of the redistribution layers 130, thereby allowing the solder balls 140 to be easily connected to the redistribution layers 130.

The redistribution layers 130 may be made of titanium (Ti), tungsten (W) and copper (Cu). However, the kinds of materials for the redistribution layers 130 are not limited to those specifically listed herein. In practice, the titanium (Ti) and tungsten (W) may serve as a seed layer allowing copper (Cu) to be firmly adhered to the passivation layer 115 or the first sealing part 120 while allowing copper (Cu) to be plated thickly in the manufacture of the semiconductor device 100.

The plurality of solder balls 140 are electrically connected to the ball lands 131 provided in the redistribution layers 130, respectively. The solder balls 140 electrically connect the semiconductor die 110 to external devices. The solder balls 140 may be made of at least one selected from the group consisting of Sn—Pb, Sn—Pb—Ag, Sn—Pb—Bi, Sn—Cu, Sn—Ag, Sn—Bi, Sn—Ag—Cu, Sn—Ag—Bi, Sn—Zn, and equivalents thereof. However, the kinds of materials for the solder balls 140 are not limited to those specifically listed herein.

The second sealing part 150 encapsulates the semiconductor die 110, the redistribution layers 130 and the first sealing part 120. In particular, the second sealing part 150 encapsulates some portions of the solder balls 140. Preferably, the second sealing part 150 encapsulates approximately 10% to approximately 50% a diameter of each of the solder balls 140. Stated another way, the second sealing part 150 covers 10% to 50% of the total height of the solder balls 140, i.e., directly contacts the lower 10% to 50% of the solder balls 140.

That is to say, the solder balls 140 are electrically connected to the redistribution layers 130 and some parts, i.e., the lower 10-50%, of the solder balls 140 are fixed and locked to the redistribution layers 130 by the second sealing part 150. Therefore, detachment between the redistribution layers 130 and the solder balls 140 can be suppressed.

Meanwhile, the second sealing part 150 may have a coefficient of thermal expansion that is the same as or similar to that of the first sealing part 120. In order to minimize warpage of the semiconductor device 100, the first sealing part 120 and the second sealing part 150 are preferably made of materials having the same thermal expansion coefficient. In addition, the second sealing part 150 may be made of a material that is the same as or similar to that of the first sealing part 120. Likewise, in order to minimize warpage of the semiconductor device 100, the first sealing part 120 and the second sealing part 150 are preferably made of the same material.

In addition, the second sealing part 150 may also be made of at least one selected from the group consisting of an epoxy-molding compound, a liquid encapsulant, and equivalents thereof. However, the kinds of materials for the second sealing part 150 are not limited to those specifically listed herein. In practice, the second sealing part 150 may be made of a liquid encapsulant using a dispenser.

As described above, in the wafer level fan out semiconductor device 100, since the solder balls 140 are electrically connected to the redistribution layers 130 and fixed and locked by the second sealing part 150, detachment between the redistribution layers 130 and the solder balls 140 can be suppressed.

In addition, in the wafer level fan out semiconductor device 100, since the first sealing part 120 is formed at the lateral third surface 113 of the semiconductor die 110, and the second sealing part 150 having the same thermal expansion coefficient or made of the same material as that of the first sealing part 120 is formed on the semiconductor die 110 and the first sealing part 120, occurrence of warpage to the semiconductor device 100 may be suppressed.

In addition, since the second surface 112 of the semiconductor die 110 is exposed to the outside, heat dissipation efficiency of the semiconductor die 110 can be further enhanced.

Figure 2:
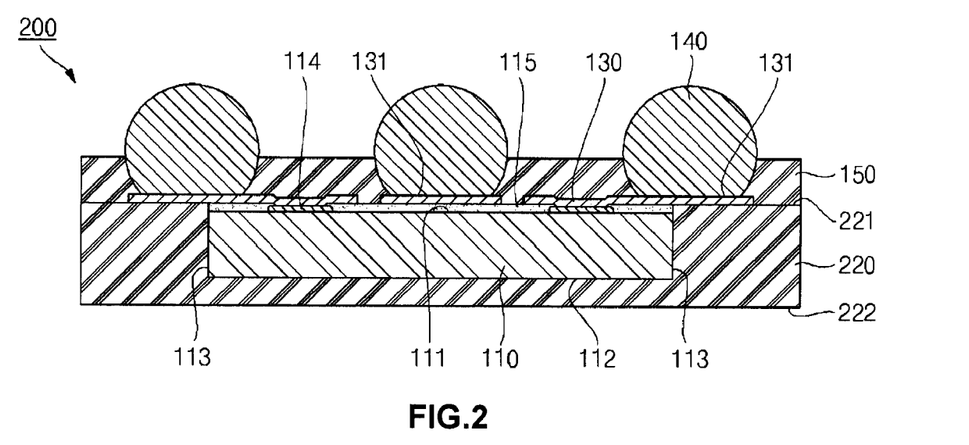
FIG. 2 is a cross-sectional view of a wafer level fan out semiconductor device according to another embodiment.

Referring to FIG. 2, a cross-sectional view of a wafer level fan out semiconductor device 200 according to another embodiment is illustrated.

As illustrated in FIG. 2, the wafer level fan out semiconductor device 200 includes the second surface 112 of the semiconductor die 110 encapsulated by a first sealing part 220. That is to say, lateral and bottom surfaces 113, 112 of the semiconductor die 110 are encapsulated by the first sealing part 220, and a top surface 111 of the semiconductor die 110 is encapsulated by the second sealing part 150.

Thus, whereas a first surface 221 of the first sealing part 220 is substantially coplanar with the passivation layer 115, a second surface 222 of the first sealing part 220 is positioned below a level of the second surface 112 of the semiconductor die 110. That is to say, the second surface 112 of the semiconductor die 110 is encapsulated by the second surface 222 of the first sealing part 220.

As described above, in the wafer level fan out semiconductor device 200, since the second surface 112 of the semiconductor die 110 is encapsulated by the first sealing part 220, it is possible to safely protect the second surface 112 of the semiconductor die 110 against external impacts.

In addition, since the first sealing part 220 is formed at the lateral and bottom surfaces 113, 112 of the semiconductor die 110 and the second sealing part 150 is formed at the top surface 111 of the semiconductor die 110, warpage can be further prevented from occurring to the wafer level fan out semiconductor device 200.

Figure 3:
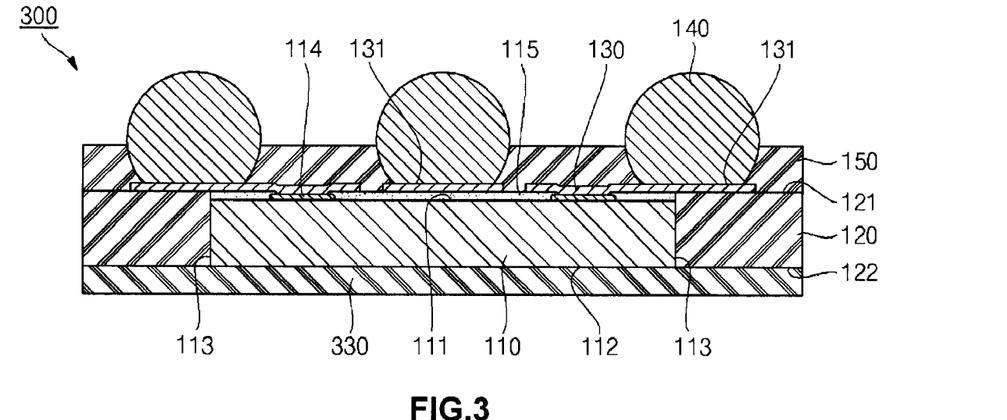
FIG. 3 is a cross-sectional view of a wafer level fan out semiconductor device according to still another embodiment.

Referring to FIG. 3, FIG. 3 is a cross-sectional view of a wafer level fan out semiconductor device 300 according to still another embodiment.

As illustrated in FIG. 3, the wafer level fan out semiconductor device 300 includes the second surface 112 of the semiconductor die 110 and the second surface 122 of the first sealing part 120 encapsulated by a third sealing part 330. The third sealing part 330 may have a thermal expansion coefficient that is the same as or similar to that of the first or second sealing part 120 or 150. In addition, the third sealing part 330 may be made of a material that is the same as or similar to that of the first or second sealing part 120 or 150.

In an exemplary embodiment, the third sealing part 330 may be made of at least one selected from the group consisting of a generally used dry insulation film, polymer, and equivalents thereof. However, the kinds of materials for the third sealing part 330 are not limited to those specifically listed herein.

As described above, in the wafer level fan out semiconductor device 300, since the second surface 112 of the semiconductor die 110 is encapsulated by the third sealing part 330, it is possible to safely protect the second surface 112 of the semiconductor die 110 against external impacts.

In addition, since the first sealing part 120 is formed at the lateral surfaces 113 of the semiconductor die 110, the second sealing part 150 is formed at the top surface 111 of the semiconductor die 110, and the third sealing part 330 is formed at the bottom surface 112 of the semiconductor die 110, warpage can be more effectively prevented from occurring to the wafer level fan out semiconductor device 300.

Figure 4:
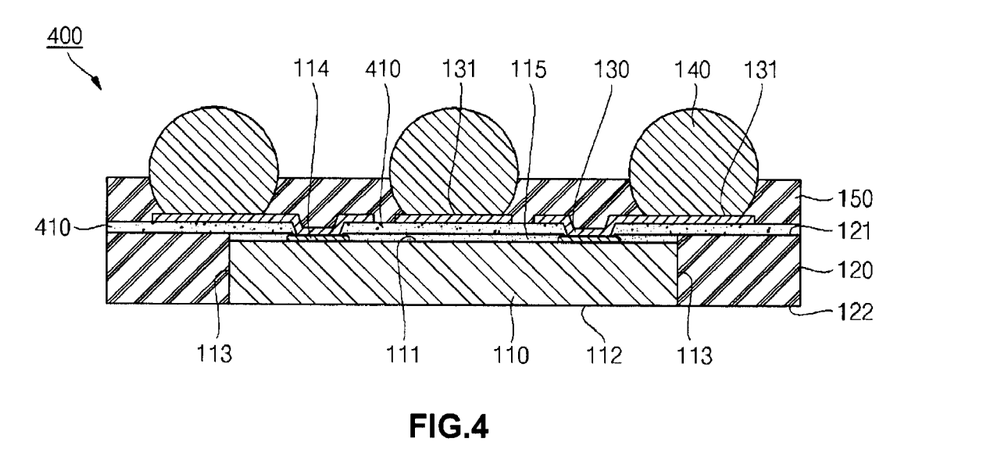
FIG. 4 is a cross-sectional view of a wafer level fan out semiconductor device according to still another embodiment.

Referring to FIG. 4, a cross-sectional view of a wafer level fan out semiconductor device 400 according to still another embodiment is illustrated.

As illustrated in FIG. 4, the wafer level fan out semiconductor device 400 further includes a dielectric layer 410 between the passivation layer 115 and the redistribution layers 130, and between the first sealing part 120 and the second sealing part 150. The redistribution layers 130 extend through openings in the dielectric layer 410 to be electrically connected to the bond pads 114 of the semiconductor die 110.

Since the dielectric layer 410 has a relatively low dielectric constant compared to the first sealing part 120 or the second sealing part 150, it may suppress signal interference between the redistribution layers 130. In addition, since the dielectric layer 410 is relatively soft, compared to the first sealing part 120 or the second sealing part 150, it may absorb external impacts applied to the solder balls 140, thereby suppressing damages to the semiconductor die 110.

The dielectric layer 410 may be made of at least one selected from the group consisting of polyimide (PI), benzocyclobutene (BCB), polybenzoxazole (PBO), bismaleimideTriazine (BT), phenolic resin, epoxy, silicone, oxide ($SiO_2$), nitride ($Si_3N_4$), and equivalents thereof. However, the kinds of materials for the dielectric layer 410 are not limited to those specifically listed herein.

In addition, the dielectric layer 410 may be formed to have a thickness of approximately 3 μm to approximately 15 μm. If the thickness of the dielectric layer 410 is less than 3 μm, the efficiency of absorbing or dampening mechanical stresses externally applied to the solder balls 140 may be lowered. If the thickness of the dielectric layer 410 is greater than 15 μm, a thickness of the wafer level fan out semiconductor device 400 may excessively increase.

Figure 5:
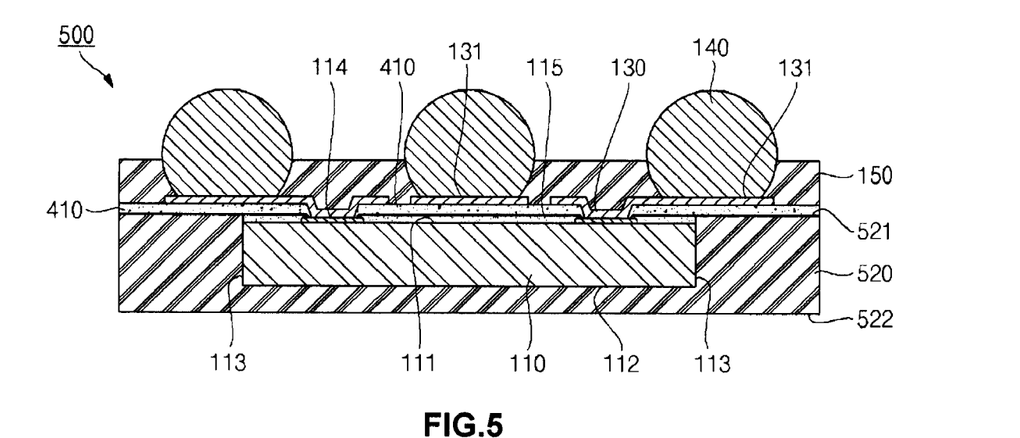
FIG. 5 is a cross-sectional view of a wafer level fan out semiconductor device according to still another embodiment.

Referring to FIG. 5, a cross-sectional view of a wafer level fan out semiconductor device 500 according to still another embodiment is illustrated.

As illustrated in FIG. 5, the wafer level fan out semiconductor device 500 includes the second surface 112 of the semiconductor die 110 encapsulated by a first sealing part 520. That is to say, lateral and bottom surfaces 113, 112 of the semiconductor die 110 are encapsulated by the first sealing part 520, and a top surface 111 of the semiconductor die 110 is encapsulated by the second sealing part 150.

Thus, whereas a first surface 521 of the first sealing part 520 is substantially coplanar with the passivation layer 115, a second surface 522 of the first sealing part 520 is positioned below a level of the second surface 112 of the semiconductor die 110.

As described above, in the wafer level fan out semiconductor device 500, since the second surface 112 of the semiconductor die 110 is encapsulated by the first sealing part 520, it is possible to safely protect the second surface 112 of the semiconductor die 110 against external impacts.

In addition, since the first sealing part 520 is formed at the lateral and bottom surfaces 113, 112 of the semiconductor die 110, and the second sealing part 150 is formed at the top surface 111 of the semiconductor die 110, warpage can be more effectively prevented from occurring to the wafer level fan out semiconductor device 500.

Figure 6:
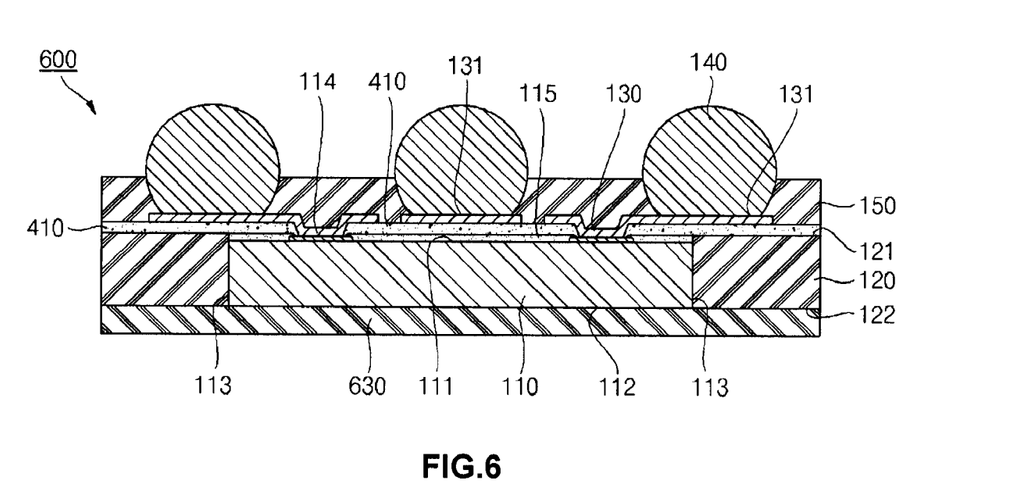
FIG. 6 is a cross-sectional view of a wafer level fan out semiconductor device according to still another embodiment.

Referring to FIG. 6, a cross-sectional view of a wafer level fan out semiconductor device 600 according to still another embodiment is illustrated.

As illustrated in FIG. 6, the wafer level fan out semiconductor device 600 includes the second surface 112 of the semiconductor die 110 and the second surface 122 of the first sealing part 120 encapsulated by a third sealing part 630.

The third sealing part 630 may have a thermal expansion coefficient that is the same as or similar to that of the first or second sealing part 120 or 150. In addition, the third sealing part 630 may be made of a material that is the same as or similar to that of the first or second sealing part 120 or 150.

In an exemplary embodiment, the third sealing part 630 may be made of at least one selected from the group consisting of a generally used dry insulation film, polymer, and equivalents thereof. However, the kinds of materials for the third sealing part 630 are not limited to those specifically listed herein.

As described above, in the wafer level fan out semiconductor device 600, since the second surface 112 of the semiconductor die 110 is encapsulated by the third sealing part 630, it is possible to safely protect the second surface 112 of the semiconductor die 110 against external impacts.

In addition, since the first sealing part 120 is formed at the lateral surfaces 113 of the semiconductor die 110, the second sealing part 150 is formed at the top surface 111 of the semiconductor die 110, and the third sealing part 630 is formed at the bottom surface 112 of the semiconductor die 110, warpage can be more effectively prevented from occurring to the wafer level fan out semiconductor device 600.

Figure 7:
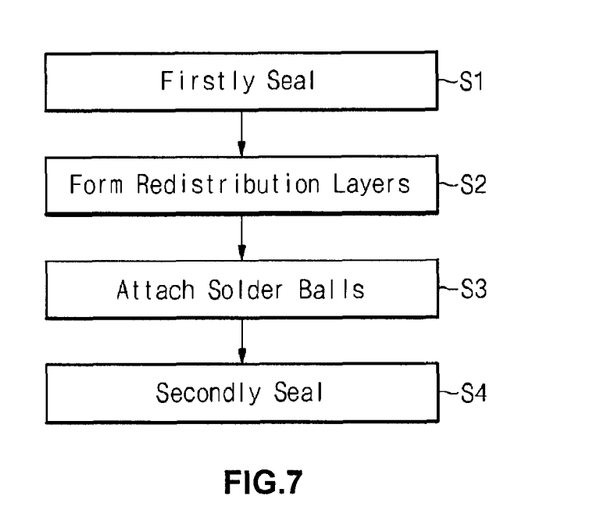
FIG. 7 is a flowchart illustrating a manufacturing method of a wafer level fan out semiconductor device according to still another embodiment.

Referring to FIG. 7, a flowchart illustrating a manufacturing method of the wafer level fan out semiconductor device 100 according to still another embodiment is illustrated.

As illustrated in FIG. 7, the manufacturing method of a wafer level fan out semiconductor device 100 includes a firstly seal operation S1, a form redistribution layers operation S2, an attach solder balls operation S3, and a secondly seal operation S4.

Referring to FIGS. 8A through 8D, cross-sectional views sequentially illustrating a manufacturing method of the wafer level fan out semiconductor device 100 according to still another embodiment are illustrated.

Figure 8A:
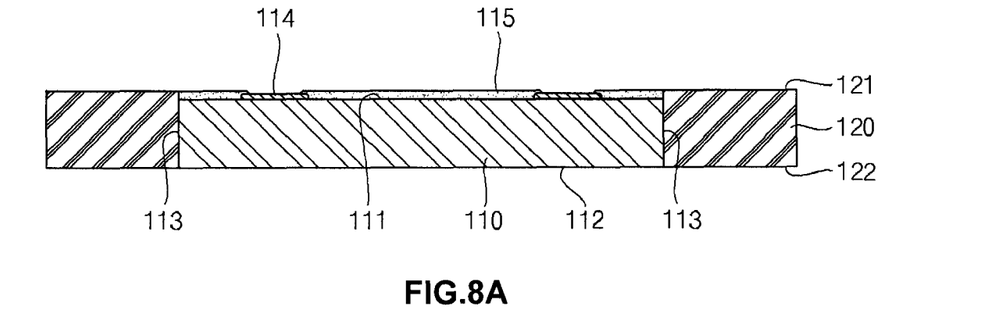
FIGS. 8A, 8B, 8C, and 8D are cross-sectional views sequentially illustrating a manufacturing method of a wafer level fan out semiconductor device according to still another embodiment.

As illustrated in FIG. 8A, in the firstly seal operation S1, a first sealing part 120 is formed on lateral surfaces 113 of a semiconductor die 110. Here, the semiconductor die 110 includes a first surface 111, a second surface 112, a plurality of third surfaces 113 formed between the first surface 111 and the second surface 112, a plurality of bond pads 114 formed on the first surface 111, and a passivation layer 115 formed on the first surface 111 corresponding to the outer periphery of the plurality of bond pads 114.

The semiconductor die 110 is placed in a mold (not shown) having cavities (not shown) formed at regions corresponding to the third surfaces 113, and a high-temperature, and high-pressure epoxy molding compound is injected into the cavities, thereby forming the first sealing part 120 having a first surface 121 and a second surface 122.

Here, the passivation layer 115 of the semiconductor die 110 is coplanar with the first surface 121 of the first sealing part 120, and the second surface 112 of the semiconductor die 110 is coplanar with the second surface 122 of the first sealing part 120. Thus, the second surface 112 of the semiconductor die 110 is exposed to the outside. Although the method of forming the first sealing part 120 using a mold has been illustrated herein, the first sealing part 120 may also be formed using a dispenser.

Figure 8B:
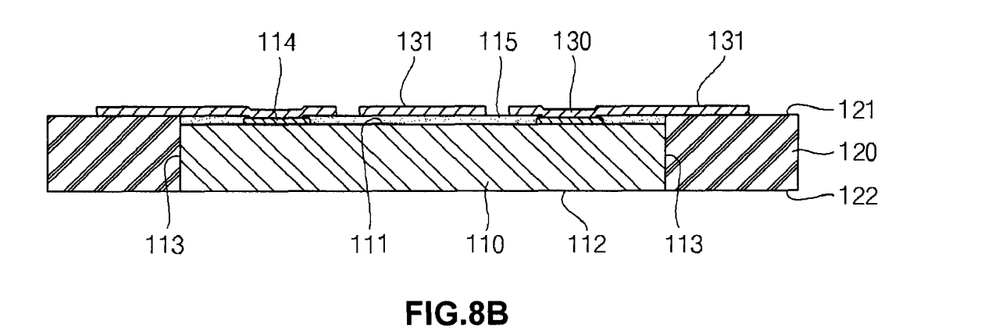

As illustrated in FIG. 8B, in the form redistribution layers operation S2, a plurality of redistribution layers 130 are formed on the passivation layer 115 of the semiconductor die 110 and on the first surface 121 of the first sealing part 120. That is to say, the redistribution layers 130 are formed in this stage, the redistribution layers 130 having first ends electrically connected to the plurality of bond pads 114 of the semiconductor die 110 and second ends extending to the passivation layer 115 or the first surface 121 of the first sealing part 120 by a predetermined length, and including circular ball lands 131 provided at distal ends thereof.

More specifically, a seed layer is formed on the passivation layer 115 of the semiconductor die 110 and on the first surface 121 of the first sealing part 120 using titanium and tungsten. Next, photoresist is coated, and exposure and developing processes are performed on the resultant structure, thereby defining a pattern so that a predetermined region of the seed layer is exposed outside the photoresist.

Next, copper (Cu) is relatively thickly plated on the seed layer inside the pattern formed of the photoresist, thereby forming the redistribution layers 130. Subsequently, the photoresist and the seed layer disposed outside the redistribution layers 130 are completely etched to then be removed. Since the seed layer or photoresist and the etching are all known very well in the art, they are not illustrated.

Figure 8C:
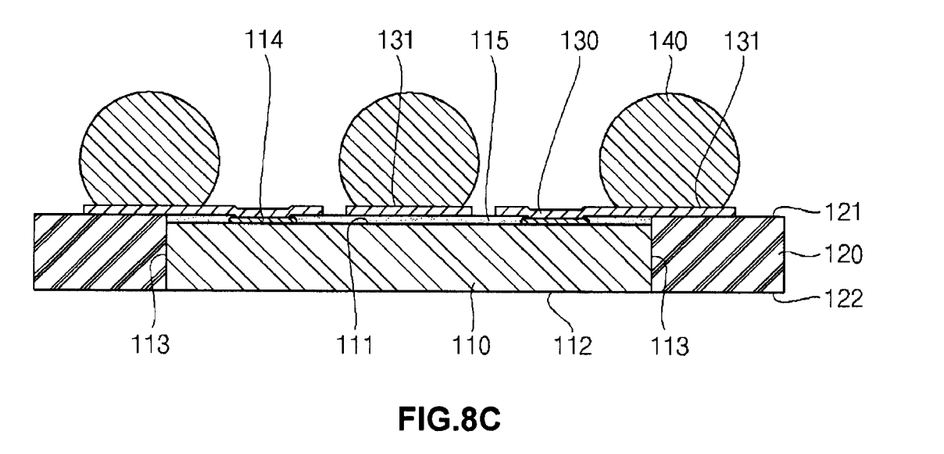

As illustrated in FIG. 8C, in the attach solder balls operation S3, the solder balls 140 each having an approximately circular shape are attached to the redistribution layers 130 formed on the passivation layer 115 or the first sealing part 120.

Viscous flux, for example, is first coated on the ball lands 131, and the solder balls 140 are then positioned on the flux. Next, when the semiconductor die 110 is introduced into a furnace maintained at a temperature ranging from 150° C. to 300° C., and taken out from the furnace, the flux is volatilized to then be eliminated and the circular-shaped solder balls 140 are fused to the ball lands 131 of the redistribution layers 130.

Figure 8D:
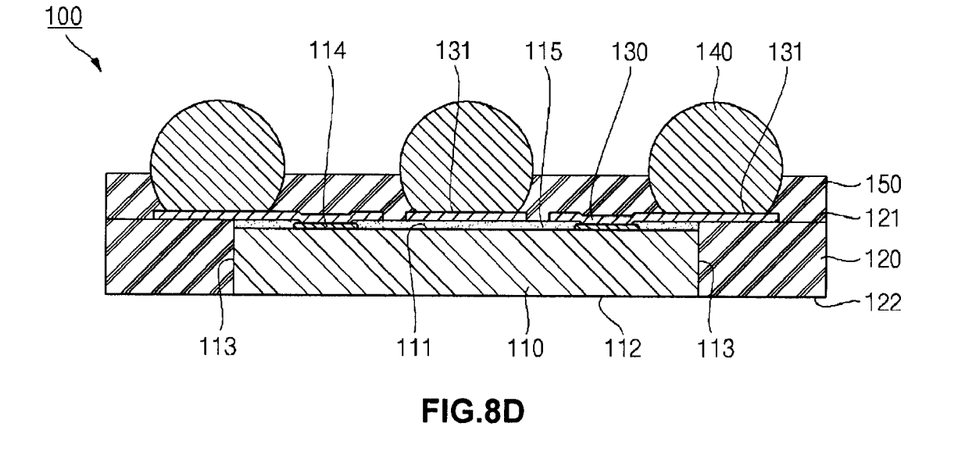

As illustrated in FIG. 8D, in the secondly seal operation S4, some regions of the solder balls 140 are encapsulated by a second sealing part 150. A liquid encapsulant is dispensed on the passivation layer 115, the redistribution layers 130, the first sealing part 120 and the solder balls 140 using, for example, a dispenser, followed by curing for a predetermined time.

In addition to the method using the dispenser, the second sealing part 150 may also be formed by a method using a mold. Meanwhile, the second sealing part 150 encapsulates approximately 10% to approximately 50% a diameter of each of the solder balls 140 as explained above. In such a manner, the solder balls 140 are locked by the second sealing part 150.

As described above, in the wafer level fan out semiconductor device 100, the first sealing part 120 is formed on the lateral surface 113 of the semiconductor die 110, and the second sealing part 150 having the same thermal expansion coefficient as that of the first sealing part 120 is formed on the top surface 111 of the semiconductor die 110, occurrence of warpage to the semiconductor device 100 may be suppressed.

In addition, in the wafer level fan out semiconductor device 100, since the solder balls 140 are attached not only to the redistribution layers 130 but also to the second sealing part 150, detachment between the redistribution layers 130 and the solder balls 140 can be suppressed.

Figure 9:
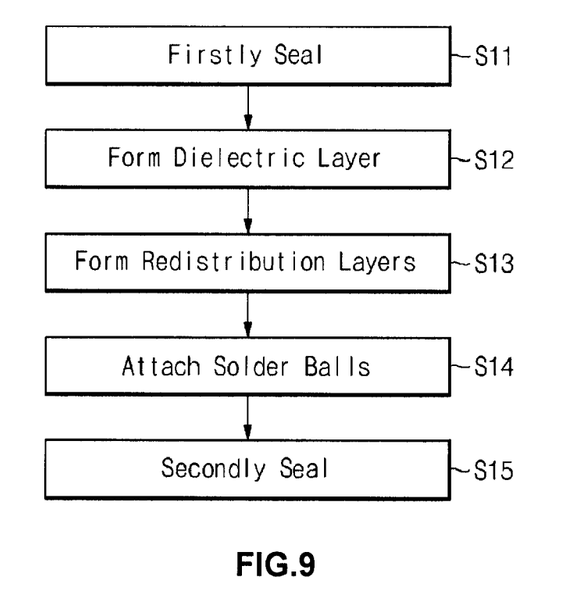
FIG. 9 is a flowchart illustrating a manufacturing method of a wafer level fan out semiconductor device according to still another embodiment.

Referring to FIG. 9, a flowchart illustrating a manufacturing method of the wafer level fan out semiconductor device 400 according to still another embodiment is illustrated.

As illustrated in FIG. 9, the manufacturing method of the wafer level fan out semiconductor device 400 includes a firstly seal operation S11, a form dielectric layer operation S12, a form redistribution layers operation S13, an attach solder balls operation S14, and a secondly seal operation S15.

Referring to FIGS. FIGS. 10A through 10E, cross-sectional views sequentially illustrating a manufacturing method of the wafer level fan out semiconductor device 400 according to still another embodiment are illustrated.

Figure 10A:
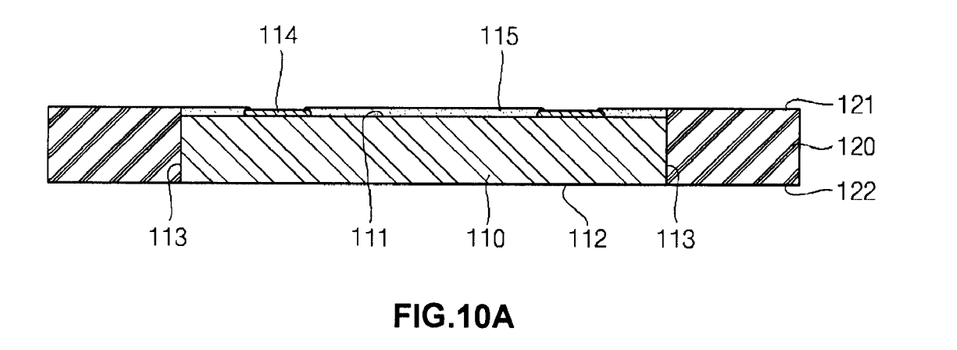
FIGS. 10A, 10B, 10C, 10D, and 10E are cross-sectional views sequentially illustrating a manufacturing method of a wafer level fan out semiconductor device according to still another embodiment.
Figure 10B:
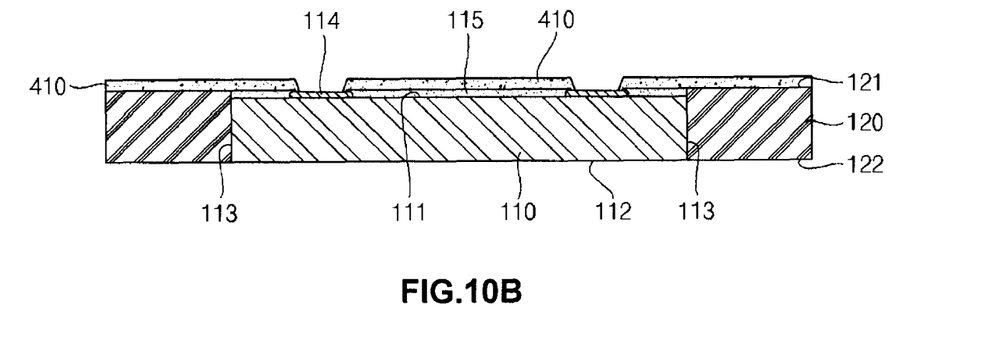
Figure 10C:
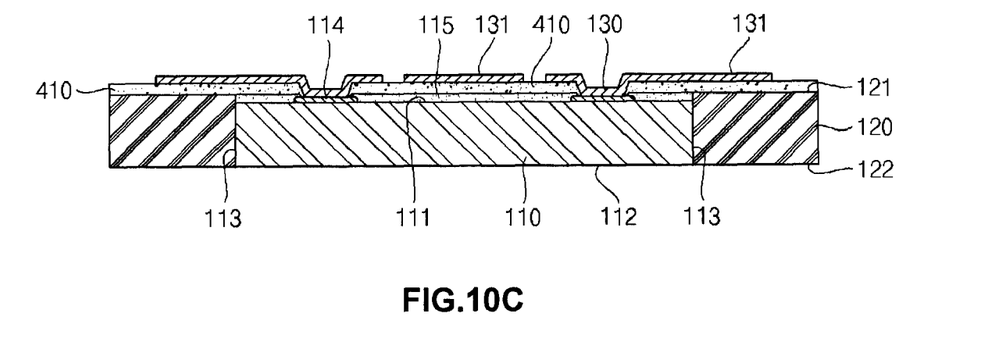
Figure 10D:
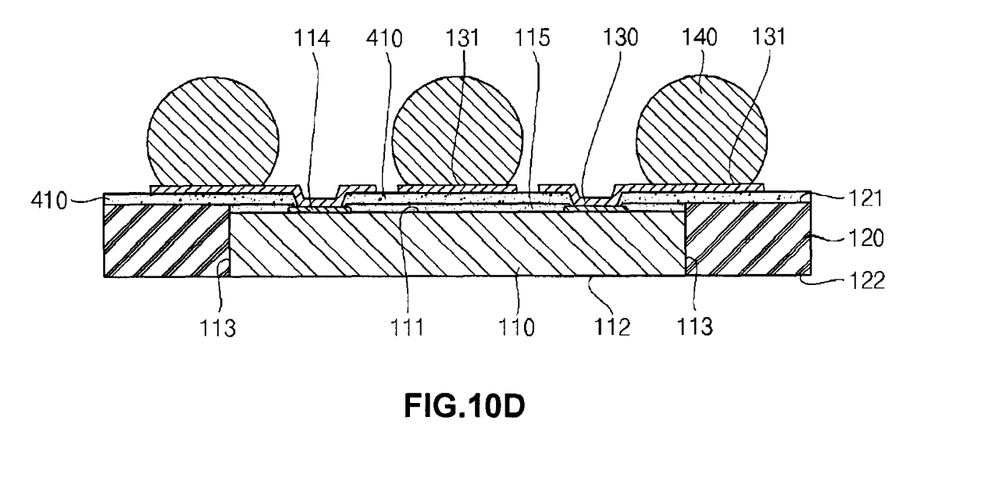
Figure 10E:
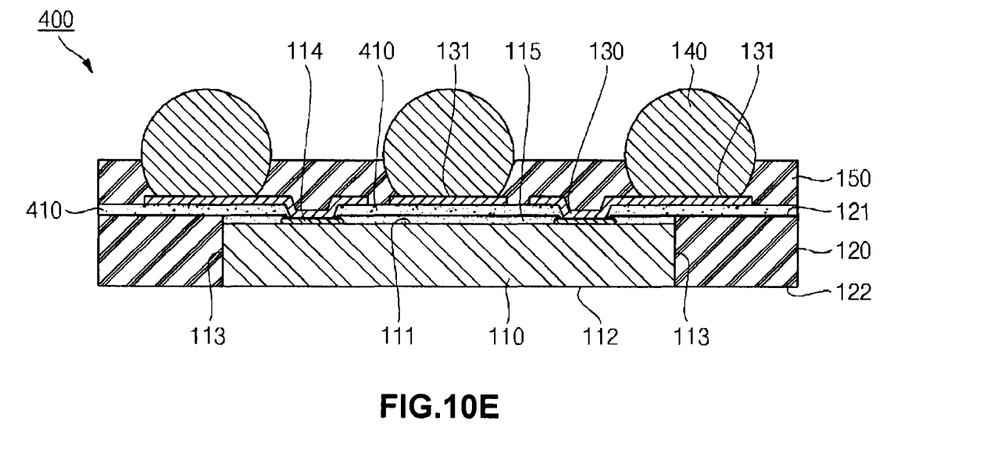

The firstly seal operation S11, the attach solder balls operation S14, and the secondly seal operation S15 illustrated in FIGS. 10A, 10D and 10E are the same or similar as the firstly seal operation S1, the attach solder balls operation S3, and the secondly seal operation S4 illustrated in FIGS. 8A, 8C and 8D and described in the previous embodiment, descriptions thereof will not be given.

As illustrated in FIG. 10B, in the form dielectric layer operation S12, a dielectric layer 410 having a predetermined thickness is formed on the passivation layer 115 of the semiconductor die 110 and on the first surface 121 of the first sealing part 120. Here, a plurality of bond pads 114 of the semiconductor die 110 extend through the dielectric layer 410 to then be exposed to the outside.

To this end, after forming the dielectric layer 410 having a predetermined thickness on the passivation layer 115 of the semiconductor die 110 and on the first surface 121 of a first sealing part 120, photoresist is coated and exposure and development processes are performed thereon. As a result, the dielectric layer 410 corresponding to the plurality of bond pads 114 is exposed to the outside. Next, an etching process is performed using the photoresist as a mask, thereby etching and removing the exposed dielectric layer 410. Accordingly, the plurality of bond pads 114 are exposed to the outside. The photoresist is removed in a subsequent process.

As illustrated in FIG. 10C, in the form redistribution layers operation S13, a plurality of redistribution layers 130 are formed on a surface of the dielectric layer 410. That is to say, the redistribution layers 130 are formed in this stage, the redistribution layers 130 having first ends electrically connected to the plurality of bond pads 114 of the semiconductor die 110 and second ends extending to the dielectric layer 410 by a predetermined length, and including circular ball lands 131 provided at distal ends thereof.

More specifically, a seed layer is formed on the plurality of bond pads 114 and the dielectric layer 410 using titanium and tungsten. Next, photoresist is coated, and exposure and developing processes are performed on the resultant structure, thereby defining a pattern so that a predetermined region of the seed layer is exposed outside the photoresist. Next, copper (Cu) is relatively thickly plated on the seed layer inside the pattern formed of the photoresist, thereby forming the redistribution layers 130. Subsequently, the photoresist and the seed layer disposed outside the redistribution layers 130 are completely etched to then be removed.

Although specific embodiments were described herein, the scope of the invention is not limited to those specific embodiments. Numerous variations, whether explicitly given in the specification or not, such as differences in structure, dimension, and use of material are possible. The scope of the invention is at least as broad as given by the following claims.

What is claimed is:

1. A semiconductor device, comprising:
   a semiconductor die comprising a die top side, a die bottom side, and die sidewalls between the die top side and the die bottom side;
   a first dielectric layer over the die top side, wherein the first dielectric layer comprises a first dielectric layer top side, a first dielectric layer bottom side; and first dielectric layer sidewalls between the first dielectric layer top side and the first dielectric layer bottom side;
   a conductive structure in the first dielectric layer, wherein the conductive structure comprises a conductive structure bottom side coupled to the die top side and a conductive structure top side exposed at the first dielectric layer top side;
   a sealing part coupled to the die sidewalls, wherein the sealing part comprises a sealing part top side, a sealing part bottom side, and sealing part sidewalls between the sealing part top side and the sealing part bottom side, and wherein the sealing part encapsulates and contacts the die sidewalls and the first dielectric layer sidewalls;
   a second dielectric layer having a second dielectric layer top side, a second dielectric layer bottom side, and second dielectric layer sidewalls between the second dielectric layer top side and the second dielectric layer bottom side, wherein the second dielectric layer bottom side contacts the first dielectric layer top side and contacts the sealing part top side;
   a conductive land above the sealing part top side and beyond a die sidewall of the die sidewalls, wherein the conductive land comprises a land top side and a land bottom side;
   a conductive path comprising a conductive path bottom side contacting the second dielectric layer top side, the conductive path comprising a conductive path first end coupled to the conductive structure top side and a conductive path second end coupled to the land bottom side; and
   an interconnection structure coupled to the land top side, wherein the interconnection structure is peripherally distributed beyond the die sidewall.

2. The semiconductor device of claim 1, wherein the second dielectric layer bottom side extends no lower than the first dielectric layer.

3. The semiconductor device of claim 1, wherein the first dielectric layer comprises polyimide.

4. The semiconductor device of claim 1, wherein the sealing part further comprises a surface that is coplanar with the die bottom side.

5. The semiconductor device of claim 1, wherein the die bottom side defines an external surface of the semiconductor device.

6. The semiconductor device of claim 1, wherein the sealing part encapsulates the die bottom side.

7. The semiconductor device of claim 1, wherein the interconnection structure comprises a solder ball.

8. The semiconductor device of claim 1, wherein the conductive structure further comprises conductive structure sidewalls joining the conductive structure bottom side to the conductive structure top side.

9. The semiconductor device of claim 1, wherein a sealing part sidewall of the sealing part sidewalls is coplanar with a second dielectric layer sidewall of the second dielectric layer sidewalls.

10. A semiconductor device, comprising:
    a semiconductor die comprising a die top side, a die bottom side, and die sidewalls between the die top side and the die bottom side;
    a first dielectric layer over the die top side, wherein the first dielectric layer comprises a first dielectric layer top side, a first dielectric layer bottom side; and first dielectric layer sidewalls between the first dielectric layer top side and the first dielectric layer bottom side;
    a conductive structure in the first dielectric layer, wherein the conductive structure comprises a conductive structure bottom side coupled to the die top side and a conductive structure top side exposed at the first dielectric layer top side;
    an encapsulant layer comprises an encapsulant layer top side, an encapsulant layer bottom side, and encapsulant layer sidewalls between the encapsulant layer top side and the encapsulant layer bottom side, wherein the encapsulant layer encapsulates and contacts the die sidewalls and the first dielectric layer sidewalls;
    a second dielectric layer having a second dielectric layer top side, a second dielectric layer bottom side, and second dielectric layer sidewalls between the second dielectric layer top side and the second dielectric layer bottom side, wherein the second dielectric layer bottom side contacts the first dielectric layer top side and contacts the encapsulant layer top side;
    a conductive path on the second dielectric layer top side that laterally extends beyond a die sidewall of the die sidewalls and over the encapsulant layer top side, wherein conductive path comprises a conductive path top side and a conductive path bottom side, and wherein the conductive path bottom side is coupled to the conductive structure top side; and
    an interconnection structure coupled to a location of the conductive path top side that positions the interconnection structure at least partially over the encapsulant layer top side.

11. The semiconductor device of claim 10, wherein the die bottom side defines an external surface of the semiconductor device.

12. The semiconductor device of claim 10, wherein the encapsulant layer encapsulates the die bottom side.

13. The semiconductor device of claim 10, wherein the first dielectric layer comprises polyimide.

14. The semiconductor device of claim 10, wherein the conductive structure further comprises conductive structure sidewalls joining the conductive structure bottom side to the conductive structure top side.

15. The semiconductor device of claim 10, wherein the interconnection structure comprises a solder ball.

16. The semiconductor device of claim 10, wherein an encapsulant layer sidewall of the encapsulant layer sidewalls is coplanar with a second dielectric layer sidewall of the second dielectric layer sidewalls.

17. A method of forming a semiconductor device, the method comprising:

providing a semiconductor die with a first dielectric layer and a conductive structure in the first dielectric layer, wherein:
  the semiconductor die comprises a die top side, a die bottom side, and die sidewalls between the die top side and the die bottom side;
  the first dielectric layer comprises a first dielectric layer top side, a first dielectric layer bottom side over the die top side, and first dielectric layer sidewalls between the first dielectric layer top side and the first dielectric layer bottom side;
  the conductive structure comprises a conductive structure bottom side coupled to the die top side and a conductive structure top side exposed at the first dielectric layer top side;
encapsulating the die sidewalls and the first dielectric layer sidewalls in an encapsulating material that contacts the die sidewalls and the first dielectric layer sidewalls to form an encapsulant layer comprising an encapsulant layer top side, an encapsulant layer bottom side, and encapsulant layer sidewalls between the encapsulant layer top side the encapsulant layer bottom side;
forming a second dielectric layer over the first dielectric layer such that the second dielectric layer comprises a second dielectric layer top side, a second dielectric layer bottom side contacting the first dielectric layer top side and the encapsulant layer top side, and second dielectric layer sidewalls between the second dielectric layer top side and the second dielectric layer bottom side;
forming conductive path on the second dielectric layer top side that laterally extends beyond a die sidewall of the die sidewalls and over the encapsulant layer top side, wherein the conductive path comprises a conductive path top side and a conductive path bottom side, and wherein the conductive path bottom side is coupled to the conductive structure top side; and
providing an interconnection structure at a location of the conductive path top side that positions the interconnection structure at least partially over the encapsulant layer top side.

18. The method of claim 17, wherein encapsulating covers the die bottom side with the encapsulating material.

19. The method of claim 17, wherein forming the second dielectric layer forms the second dielectric layer such that the second dielectric layer bottom side extends no lower than the first dielectric layer.

20. The method of claim 17, wherein forming the encapsulant layer provides an encapsulant layer sidewall of the encapsulant layer sidewalls that is coplanar with a second dielectric layer sidewall of the second dielectric layer sidewalls.

* * * * *